(12) United States Patent
Peng et al.

(10) Patent No.: US 7,262,619 B2
(45) Date of Patent: Aug. 28, 2007

(54) SEMICONDUCTOR DEVICE TEST SYSTEM

(75) Inventors: Nai Liang Peng, Taipei (TW); Shou Ping Hsu, Sindian (TW)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 11/067,871

(22) Filed: Feb. 28, 2005

(65) Prior Publication Data

US 2006/0194352 A1    Aug. 31, 2006

(51) Int. Cl.
*G01R 31/02* (2006.01)
*G01R 1/00* (2006.01)

(52) U.S. Cl. .............. 324/760; 324/765; 324/158.1

(58) Field of Classification Search .......... 324/760
See application file for complete search history.

(56) References Cited

U.S. PATENT DOCUMENTS

| | | | |
|---|---|---|---|
| 6,104,202 A | 8/2000 | Slocum et al. | |
| 6,420,885 B1 | 7/2002 | Fredrickson | |
| 6,420,888 B1 | 7/2002 | Griffin et al. | |
| 6,703,852 B1 * | 3/2004 | Feltner | 324/754 |
| 6,731,127 B2 | 5/2004 | Watts | |
| 6,838,897 B2 * | 1/2005 | Kim et al. | 324/760 |
| 6,842,030 B2 * | 1/2005 | Kim et al. | 324/765 |
| 6,861,861 B2 * | 3/2005 | Song et al. | 324/760 |

* cited by examiner

*Primary Examiner*—Ha Tran Nguyen
*Assistant Examiner*—Emily Y Chan
(74) *Attorney, Agent, or Firm*—Yingsheng Tung; Wade James Brady, III; Frederick J. Telecky, Jr.

(57) ABSTRACT

An apparatus for mitigating condensation formation on a device interface board during low-temperature semiconductor device testing includes a nozzle. The nozzle includes an input orifice for receiving gas from a gas source and at least one output orifice for discharging gas from the nozzle against a surface of the device interface board. The area of the at least one output orifice is substantially greater than the area of input orifice.

15 Claims, 4 Drawing Sheets

SEMICONDUCTOR DEVICE TEST SYSTEM

TECHNICAL FIELD

The present invention relates to a semiconductor device test system, and, more particularly, to an apparatus that mitigates condensation formation associated with low-temperature semiconductor device testing.

BACKGROUND OF THE INVENTION

As circuit density continues to increase, the testing of integrated circuit semiconductor devices becomes ever more important. Such testing is provided to determine whether electrical characteristics of the products operate normally, while the operating environment varies. For example, the circuit under test can be subject to an HVS (High Voltage Stress) test based on a gradually varied use range of the products and subject to an extreme environment test, such as of high temperature, low temperature and very low temperature.

Testing under a low temperature and a very low temperature atmosphere is more difficult than testing under a high temperature atmosphere. During low-temperature testing, semiconductor devices are placed in a handler containing a cool dry environment maintained at a temperature in the range of, for example, 0° C. to −58° C. An interface board that includes a test socket for receiving the cooled semiconductor devices is mounted over an opening in the handler. The handler presses the cooled semiconductor devices against the test socket. A device tester then transmits test signals to the test socket through conductive traces formed on the interface board, thereby applying the test signals to the cooled semiconductor devices.

Moisture that is present in the ambient air surrounding the interface board can potentially condense on cooled portions of the interface board exposed to ambient air. This condensation can cause leakage current, and a repeated shrinkage and expansion of the condensed moisture causes potential damage and breakage of the respective components.

SUMMARY OF THE INVENTION

The present invention relates to an apparatus for mitigating condensation formation on a device interface board- during low-temperature semiconductor device testing. The apparatus comprises a nozzle. The nozzle includes an input orifice for receiving gas from a gas source and at least one output orifice for discharging gas from the nozzle against a surface of the device interface board. The area of the at least one output orifice is substantially greater than the area of input orifice. The ram pressure and the velocity of the gas discharged from the at least one output orifice are substantially lower than the ram pressure and velocity of the gas received at the input orifice.

In an aspect of the invention, the nozzle can comprise a member with a substantially planar first surface and a substantially planar second surface. The input orifice can be provided on the first surface and the at least one output orifice can be provided on the second surface. The nozzle can comprise a plurality of output orifices that are coupled to the input orifice by a plurality of output channels. The output channels can be concentrically arranged with respect to center of the member. The plurality of output orifices can also be concentrically arranged with respect to the center of the member so they are substantially distributed across the second surface of the member.

In another aspect of the invention, a first surface of the device interface board can be positioned in an opening of a chamber that contains a gas at a first pressure and temperature. A second surface of the device interface board being arranged outside the chamber. The ram pressure of the gas discharged from the output orifices is substantially lower than the pressure of the gas contained in the chamber so that moisture in the ambient is prevented from entering the chamber.

The present invention also relates to a system for semiconductor device testing. The semiconductor device test system inlcudes a chamber containing gas at a first pressure. A device interface board having a first surface is arranged inside the chamber. A second surface of the device interface board is arranged outside the chamber. A nozzle is coupled to a gas source, which is maintained at a second pressure. The nozzle discharges gas against the second surface of the device interface board at a pressure substantially lower than the first pressure and the second pressure.

The nozzle of the semiconductor device test system can comprise a member with a substantially planar first surface and a substantially planar second surface. The input orifice can be provided on the first surface and the at least one output orifice can be provided on the second surface. The nozzle can comprise a plurality of output orifices that are coupled to the input orifice by a plurality of output channels. The output channels can be concentrically arranged with respect to center of the member. The plurality of output orifices can also be concentrically arranged with respect to the center of the member so they are substantially distributed across the second surface of the member.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates to a purge apparatus for mitigating condensation formation on a device interface board of semiconductor device testing apparatus during low-temperature semiconductor device testing. During low-temperature testing, such as at temperatures ranging from about 0° C. to about −58° C., the semiconductor device test can potentially cause moisture condensation on the device interface board (DIB). Moisture can cause electrical leakage and/or electrical short-circuiting that can produce erroneous test data. This potential for moisture condensation is particularly high on portions of the DIB exposed to the ambient atmosphere.

The purge apparatus of the present invention includes gas source (e.g., cold dry air source) and a nozzle that discharges a gas from the gas source at a pressure and velocity effective to mitigate potential condensation formation on the DIB. The nozzle includes an input orifice for receiving gas from the gas source and at least one output-channel and output orifice for discharging gas from the nozzle against a surface of the device interface board where potential condensation can occur. The area of the at least one output channel and output orifice is substantially greater than the area of input orifice so that the ram pressure and the velocity of the gas received from the gas source is substantially reduced when discharged against the DIB. Reducing the ram pressure and the velocity of gas discharged from the gas source can potentially lower environmental noise caused by the discharged gas (e.g., a reduction of 10 db) as well as mitigate damp ambient air from entering a handler chamber where the semiconductor device is tested. This provides a more stable environment for semiconductor device testing and improves the first pass yield and handler low temperature durability.

Figure 1:
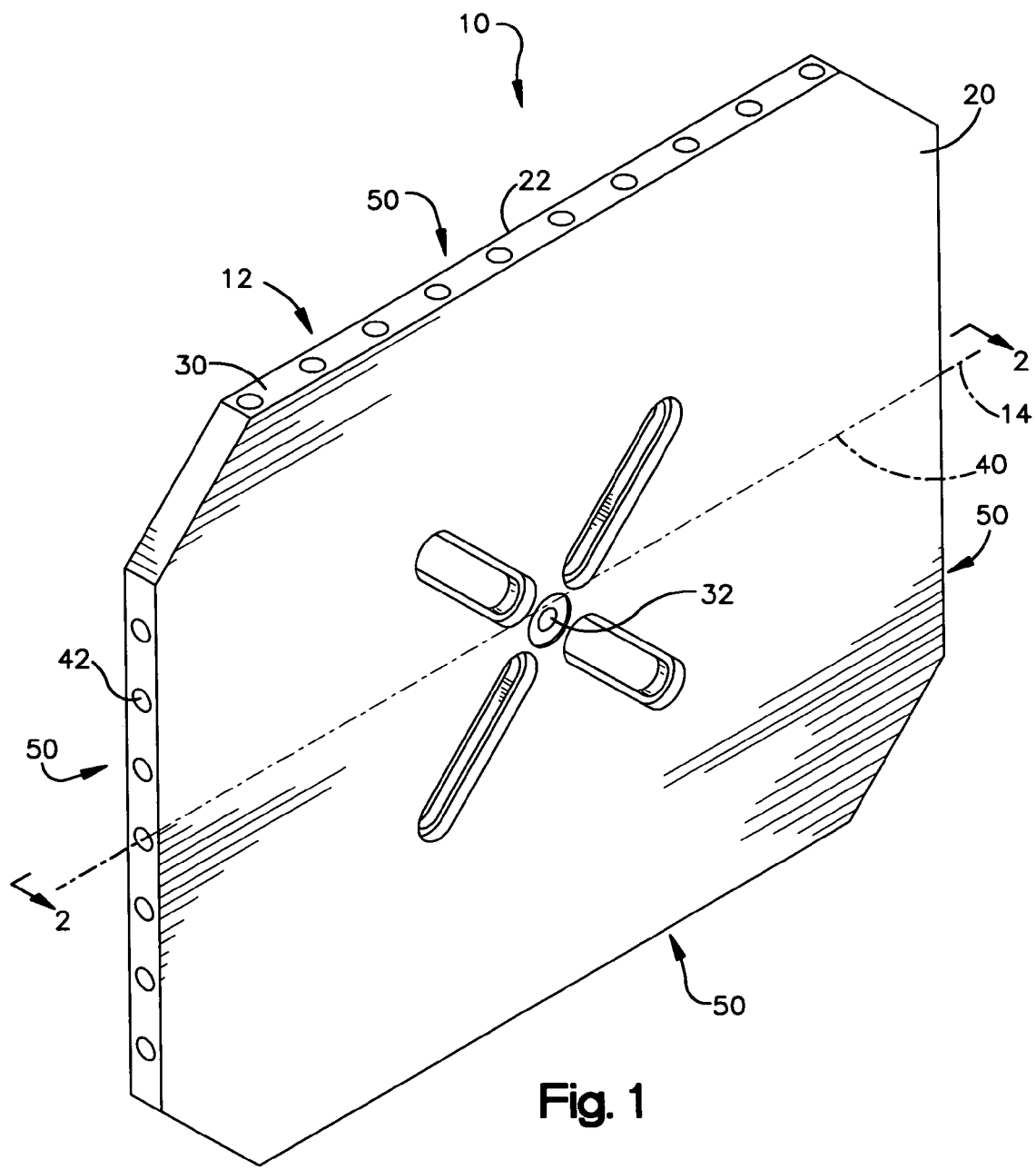
FIG. 1 illustrates a schematic perspective view of a nozzle of a purge apparatus in accordance with an aspect of the present invention.
Figure 5:
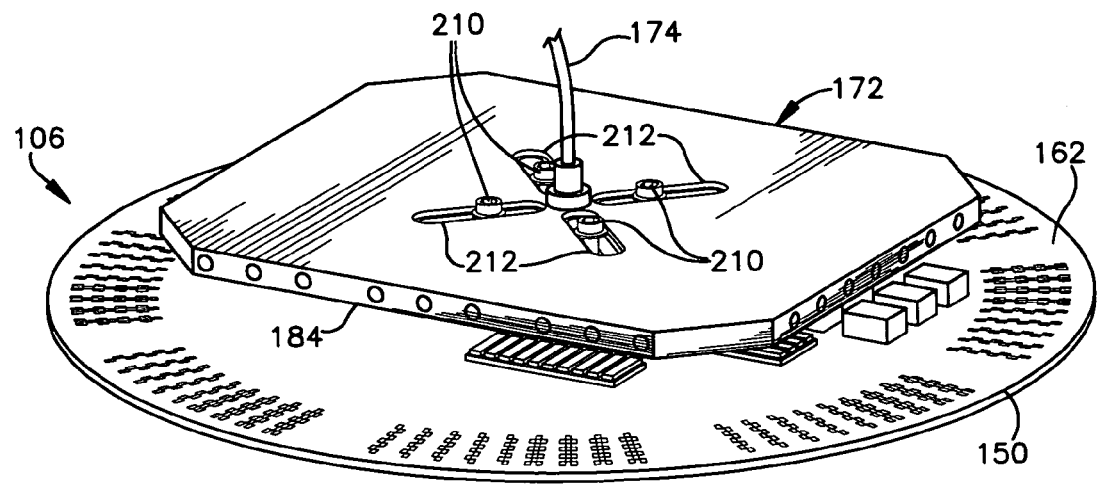
FIG. 5 illustrates a schematic view of the nozzle of the purge apparatus attached to the device interface board of the semiconductor device test system of FIG. 3.

FIG. 1 is a schematic illustration of a nozzle 10 of a purge apparatus in accordance with an aspect of the present invention. The nozzle 10 includes a substantially planar member 12 that extends along axis 14. The member 12 has a substantially planar first surface 20 (i.e., input surface) and a substantially planar second surface 22 (i.e., output surface) that faces away from and is substantially parallel to the first surface 20. The member 12 is illustrated as having a substantially rectangular outer periphery 30, but the outer periphery 30 can have other shapes, such as circular, hexagon, octagon, or square. The area of the member 12 is such that when the nozzle 20 is positioned next to a DIB (FIG. 5) the nozzle 10 will substantially overlie a central portion of the DIB.

The nozzle 10 includes an input orifice 32 that is centrally located on the first surface 20 of the member 10. The input orifice 32 can be coupled by a conduit (FIG. 3) to a gas source, such as a dry gas source (e.g., cold dry air source). Gas from the gas source can pass or be pumped through the conduit to the input orifice 32. The input orifice 32 defines an input opening to the nozzle 10 with a first cross-sectional area. The cross-sectional area of the input orifice 32 can be slightly greater or less than the cross-sectional area of the conduit coupled to the input orifice 32.

Figure 2:
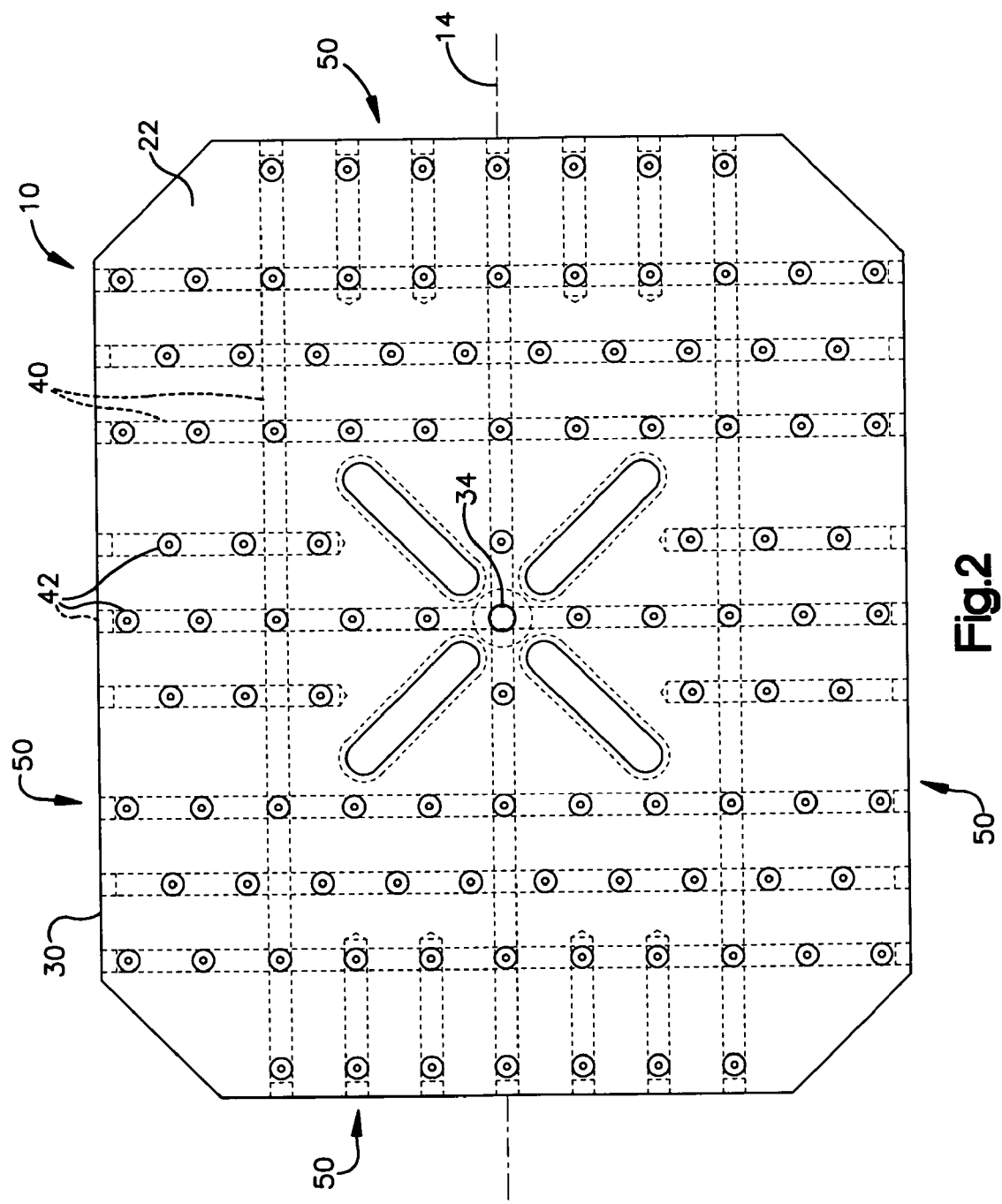
FIG. 2 illustrates a bottom-plan view of the nozzle of FIG. 1.

Referring also to FIG. 2 which a bottom-plan view of FIG. 1, the input orifice 32 is coupled to an input channel 34 that has a cross-sectional area that is essentially same as the cross-sectional area of the input orifice 32. The input channel 34 extends through the member 12 substantially perpendicular to the first surface 20, the second surface 22, and the axis 14. The input channel 34 is in turn coupled to a plurality of output channels 40 that have a combined cross-sectional area and volume that is substantially greater than the cross-sectional area and volume of the input orifice 32 and the input channel 34. The output channels 40 extend from the periphery of member 12 and through the member 12 substantially parallel to the first surface 20 and the second surface 22. The output channels 40 are arranged essentially perpendicular and substantially parallel to the axis 14 so that they form a grid (or cross-hatch) pattern in the member that extends through and is concentrically arranged about the input channel 34. Each output channel 40 can have essentially the same width. It will be appreciated though that the width of the output channels 40 can-vary from channel to channel. Moreover, the output channels 40 need not be provided in a grid pattern but could be provided other patterns, such as a star pattern or a spiral pattern.

The output channels 40 are coupled to a plurality of output orifices 42 that are used discharge gas that passes through the output channels 40 from the nozzle 10. The combined cross-sectional area of the output orifices 42 is substantially greater than the cross-sectional of the input orifice 32 and the cross-sectional area of the input channel 34. Pressurized gas that passes through the greater area (and greater volume) of the output channels 40 and that is discharged through the output orifices 42 has a reduced ram pressure and velocity in accordance with Bernoulli's principle.

The output orifices 42 are provided in the second surface 22 of the member 12 substantially along or overlying the output channels 40. The output orifices 42 are also defined in sides 50 of the outer periphery 30 of the member 10 by the output channels 40. The output orifices 42 are arranged in the second surface of the member 12 so that gas is substantially evenly discharged from second surface 22 and the sides 50 of the nozzle 10. Each of the output orifices 42 can have substantially the same cross-sectional area. It will be appreciated though that the cross-sectional area of the orifices 42 can vary from output orifice 42 to output orifice 42. For example, the output orifices on the second-surface 22 of the member 12 can have a greater cross-sectional area than the output orifices 42 on the sides 50 of the member 12 so that the gas discharge is focused against the DIB.

The nozzle 12 can be formed from any substantially rigid material, which can be readily machined or molded to provide the orifices 32 and 42 and channels 34 and 40. By way of example, the nozzle can be formed from a rigid resin, such as VESPEL, that can is resistant to electrostatic discharge (ESD). VESPEL is a high performance polyimide resin, which is commercially available from DuPont Engineering Polymers. The VESPEL resin can be molded into the shape of the substantially rectangular member. The input orifice 32, the input channel 34, the output channels 40, and the output orifices 42 can then be provided in the member 12 by drilling channels in the member 12. It will be appreciated that the nozzle 12 can be formed from other resins (e.g., TORLON, polyamide-imide resin) as well as other materials, such as metals (e.g., aluminum), ceramics, and composites.

Figure 3:
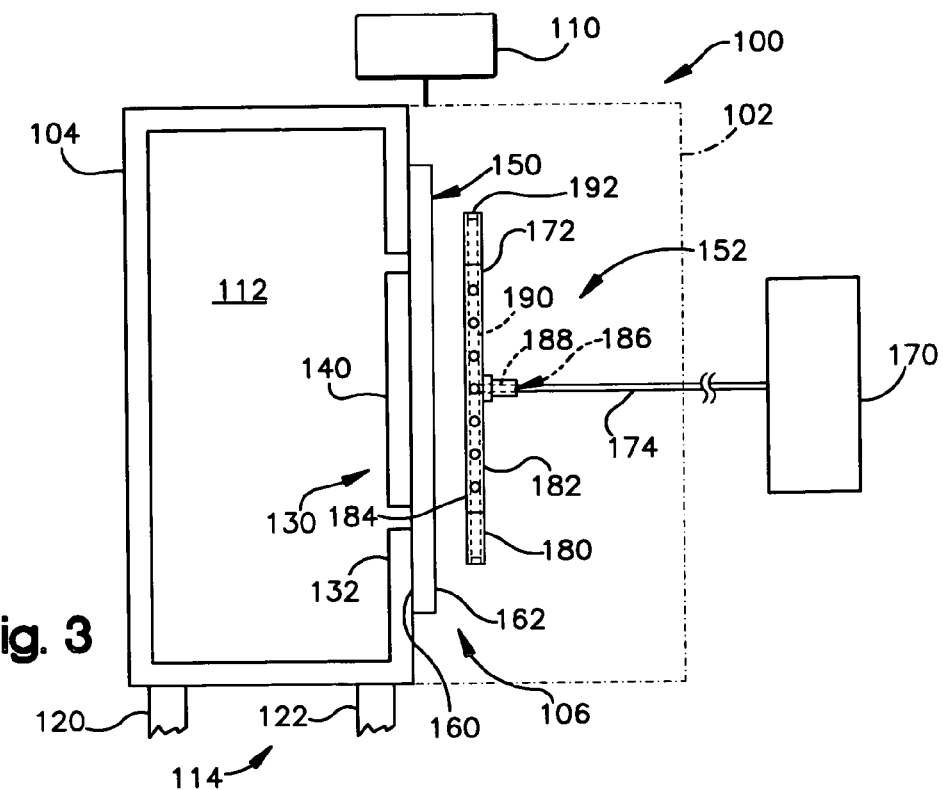
FIG. 3 illustrates a schematic view of a portion of a semiconductor device test system in accordance with an aspect of the present invention.

In accordance with an aspect of the invention, the nozzle can be used in a purge apparatus of a test system for low-temperature testing (e.g., at temperatures ranging from about 0° C. to about −58° C.) of an electronic device, such as a semiconductor device. FIG. 3 schematically illustrates a portion of a low-temperature semiconductor device test system 100 in accordance with an aspect of the invention that comprises the nozzle. The semiconductor device test system 100 includes a tester head, a handler 104, and an interface apparatus 106, which is connected between the tester head 102 and the handler 104 during low-temperature testing. The tester head 102 can include a plurality electrical connections (not shown), such as wires or pins, that electrically couple the tester head 102 to the interface apparatus 106.

The tester head 102 is also coupled to an automatic test equipment (ATE) 110 by, for example, cable or wiring. The ATE 110 typically comprises a high cost piece of equipment that includes control circuitry and test electronics as well as storage for storing the semiconductor test information obtained. The ATE 110 can include a monitor (not shown) and console (not shown) adapted to receive instructions from and provide information and communicate results to an operator. The monitor and console may be integral or attached to the ATE 110. During test procedures, the tester head transmits test signals from the ATE 110 to the device under test (DUT) (not shown) as well as transmits response signals from the DUT to the ATE 110.

The handler 104 includes and insulated chamber 112 that is connected to a cooling system 114. The cooling system 114 maintains a cool dry environment in the insulated chamber 112. The cool dry environment is typically maintained at an elevated pressure of, for example, about 20 psi to about 60 psi and at a temperature that can range, for example, from about 0° C. to about −58° C. The cooling system 114 includes a first fluid conduit 120 and second a fluid conduit 122 (e.g., first and second hoses) that can be coupled, respectively, to a cold gas source (e.g., liquid nitrogen source) (not shown) and a dry gas source (e.g., cold dry air source) (not shown). The first conduit 120 can provide the cold gas to the insulated chamber 112 at an elevated pressure (e.g. about 40 psi), and the second conduit 122 can provide the dry gas to the insulated chamber 112 at an elevated pressure (e.g., about 20 psi). The first conduit 120 and second conduit 122 can each be respectively opened or closed to adjust the temperature, pressure, and relatively humidity in the insulated chamber 112.

An opening 130 is provided in a side wall 132 of the insulated chamber 112 through which a test socket 140 of the interface apparatus 106 can be inserted. The test socket 140 when inserted in the opening 130 of the insulated chamber can receive a DUT from a device handling mechanism (not shown) that is mounted inside the insulated chamber 112. The device handling mechanism can include a robotic arm for moving a DUT from a storage location (not shown) to the test socket 140 during test procedures. The storage location can be located in the insulated chamber so that the DUT's are maintained at a desired low-temperature throughout the test procedure.

The interface apparatus 106 includes a device interface board (DIB) 150 and a purge apparatus 152. The device interface board 150 can comprise a printed circuit board (PCB) that is designed to serve as an interface between the automatic test equipment (ATE) 110 and the device under test (e.g., semiconductor device).

The DIB 150 (e.g., load board) comprises a printed circuit board (PCB) that includes the test socket 140 (or handler interface) as well as a variety of components (IC's, resistors, capacitors, inductors, relays, connectors, etc.) (FIG. 4) that make up the DIB's test circuits. A typical laminate for the PCB of the DIB comprises FR4 (Flame Retardant 4 fiber glass). The number of layers of PCB can vary, depending on the complexity of the design of the DIB.

The PCB of the DIB 150 has a first substantially planar surface 160 and a second substantially planar surface 162 that faces away from the first surface 160. The test socket 140 is centrally located on the first surface of the PCB and is adapted to mount DUTs to be tested by the device tester. Metallization (conductive) traces (not shown) can extend from test components on the first surface 160 of the PCB to associated device contacts (not shown) that extend through and are exposed on an surface of the test socket 140, thereby providing signal paths used during testing procedures.

A wide range of tests may be performed on DUTs using the DIB 150 in accordance with the present invention. Typical test procedures may comprise prescreening tests and/or detailed functional tests. Examples of such test procedures may include static and dynamic current and voltage tests, dynamic functional AC/DC tests, DC offset tests, AC timing relation tests, internal AC parametric tests, power supply current tests, leakage current tests, gain tests, and/or low speed digital pattern tests. The test procedure may also comprise external AC parametric tests, signal-to-noise ratio tests, DSP-based AC tests, distortion tests, thermal soaks, RF tests, and/or high-speed digital pattern tests with precision timing, as examples.

The semiconductor devices (i.e., DUT) tested using the DIB 150 may be packaged or unpackaged integrated circuits (ICs). The ICs can be packaged with a wide variety of types of IC packages, such as quad flat packs, ball grid arrays, and pin-grid arrays. Alternatively, the ICs tested may include IC's on wafer.

During low temperature testing, the first surface 160 of the DIB 150 can be positioned either over or in the opening 130 of the insulated chamber 112 so that the test socket 140 and portions of the first surface 160 of the DIB 150 are exposed to the cold, dry environment maintained in the insulated chamber 112 and the second surface 162 is exposed to the ambient atmosphere. The cold temperature can be conducted by the PCB and the metallization contacts that extend through the PCB to the second surface 162. Moisture from the ambient atmosphere, which can have a substantially higher relative humidity and temperature than the gas contained in the insulated chamber 112 can potentially condense on the second surface 162 of DIB 150.

Figure 6:
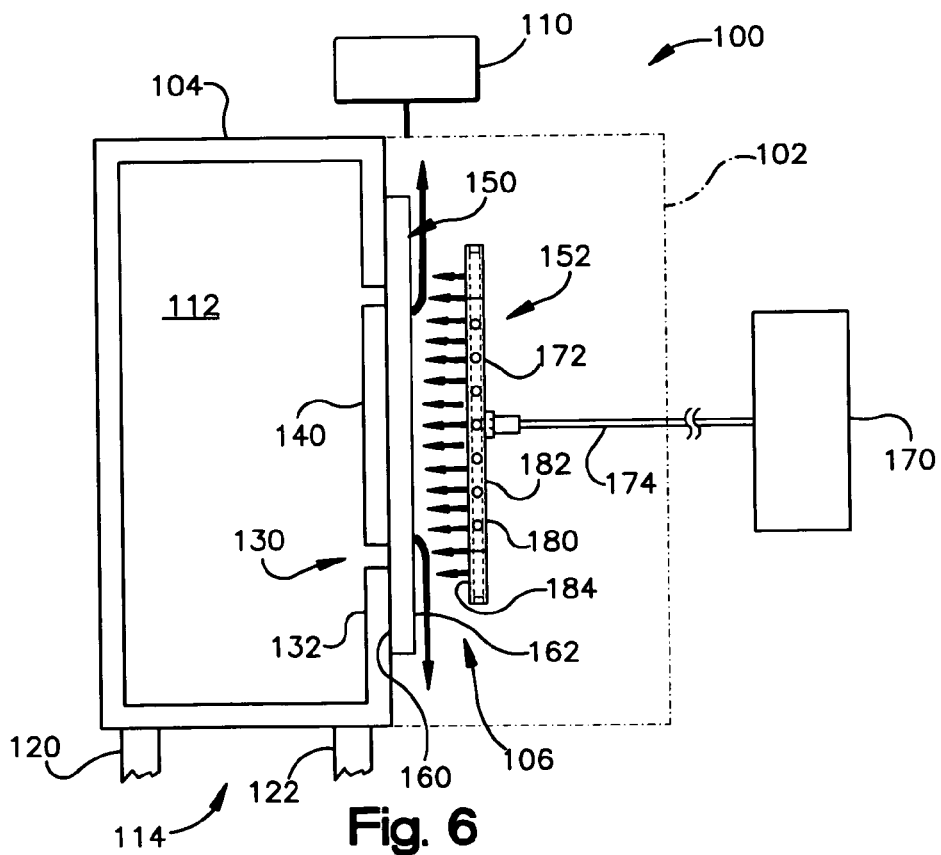
FIG. 6 illustrates a schematic view taken of the semiconductor device test system during operation.

The purge apparatus 152 of the present invention can mitigate potential moisture condensation on the second surface of the DIB 150 that can form during low-temperature testing by discharging a dry gas against the second surface 162 of the DIB 150 (FIG. 6). The purge apparatus includes a gas source 170 that is coupled to a nozzle 172 in accordance with the present invention by a conduit 174, such as a hose or pipe. The gas source 170 can comprise a pressurized gas source, such as a pressurized cold dry air source, that is maintained at an elevated pressure (e.g., about 50 psi to about 95 psi).

The nozzle 172 includes a substantially planar member 180 that has a substantially planar first surface 182 and a substantially planar second surface 184 that faces away from and is substantially parallel to the first surface 182. The area second surface 184 is such that when the nozzle 172 is positioned next to the DIB (FIG. 5), the nozzle 172 will substantially overlie a central portion of the DIB 150.

The nozzle 172 includes an input orifice 186 that is centrally located on the first surface 182 of the member 180. The input orifice 186 is coupled by the conduit 174 to the gas source 170. The cross-sectional area of the input orifice 186 can be slightly greater or less than the cross-sectional are of the conduit 174 coupled to the input orifice 186.

The input orifice 186 is coupled to an input channel 188 that has a cross-sectional area that is essentially same as the cross-sectional area of the input orifice 186. The input channel 188 is in turn coupled to a plurality of output channels 190 that have a combined cross-sectional area and volume that is substantially greater than the cross-sectional area and volume of the input orifice 186 and the input channel 188. The output channels 190 are coupled to a plurality of output orifices 192 that are used to discharge gas that passes through the nozzle 172. The combined cross-sectional area of the output orifices 192 is substantially greater than the area of the cross-sectional area of the input orifices 186 and the cross-sectional area of the input channel 188 so that the pressure of the gas that passes form the gas source 170 and through the nozzle 172 is substantially reduced in accordance with Bernoulli's principle.

Figure 4:
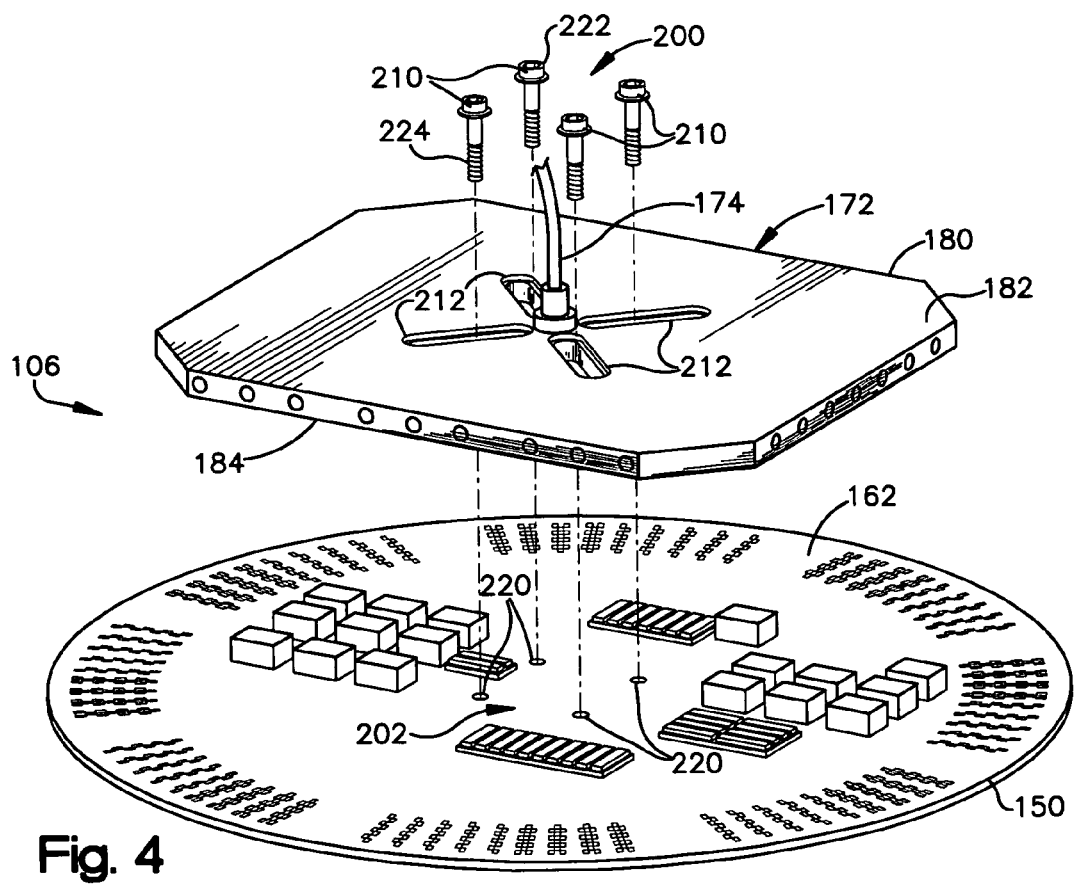
FIG. 4 illustrates a schematic view of a nozzle of a purge apparatus being attached to a device interface board of the semiconductor device test system of FIG. 3.

Referring to FIGS. 3 and 4, the interface apparatus 106 can include an attachment means 200 that is used to attach the nozzle 172 to the device interface board (DIB) 150 so that the nozzle substantially overlies a central portion 202 of the DIB 150. The attachment means 200 positions the nozzle relative the DIB such that the second surface 162 of the nozzle 172 is separated from and substantially parallel to the second surface 162 of the DIB 150. The attachment means 200 can comprise a plurality of bolts 210 that extend through apertures 212 in the member 180 of the nozzle 172 to corresponding sockets 220 in the DIB 150.

Each bolt 210 can include a head 222 and an externally threaded shank 224. The shank 224 of each bolt 210 extends through an aperture 212 in the nozzle 172 so that the head 222 of each bolt 210 contacts the first surface 182 of the nozzle 172. The threaded shank 224 of each bolt 210 can be tightened in corresponding sockets 220 provided in the DIB. It will be appreciated that the attachment means 200 is not meant to be limited to a plurality of bolts. Other attachment means that can readily attach the nozzle 172 relative the DIB 150 such that the nozzle 172 is separated from and parallel to the DIB 150 can be used in accordance with the invention.

FIG. 6 shows that during operation of the semiconductor test system 100, gas from the gas source 170 of the purge apparatus 152 is discharged at a pressure and velocity effective to mitigate moisture condensation on the second surface 162 of the DIB 150 and prevent condensation related test errors. The ram pressure of the gas discharged by the nozzle 172 can be reduced so that the ram pressure of the discharged gas is lower than the pressure of the gas provided in the insulated chamber 112. The drying gas that is provided by the gas source 170 of the purge apparatus is typically at a relatively high pressure (e.g., about 50 psi), which can be higher than the pressure of the insulated chamber 112.

The pressure of the insulated chamber 112 is based on the combined pressure of the cooling gas and the dry gas provided by, respectively, the first conduit 120 and the second conduit 122 of the cooling system 114. The insulated chamber 112 can be at an elevated pressure (e.g., about 60 psi) when both the cooling gas and the dry gas are supplied to the insulated chamber 112, such when as the temperature of the insulated chamber is being lowered to the test temperature. The pressure of the insulated chamber 112, however, can be substantially reduced (e.g., to about 20 psi) once the test temperature is reached and the cooling gas supply is closed or shut off.

The nozzle 172 in accordance with the present invention maintains the discharged gas at a pressure (e.g., about 17 psi) that is below the reduced pressure (e.g., about 20 psi) inside the chamber 112. By maintaining the pressure of the discharged gas below the pressure of gas inside the chamber 112, ambient air and moisture is prevented from potentially entering the chamber 112 through the opening 130. This is advantageous as moisture that enters the chamber 112 can form condensation or frost on the DUT that could potentially cause electrical leakage and/or electrical short-circuiting of the DUT. Moreover, the insulated chamber 112 can be maintained at a lower pressure; thus, reducing the amount and cost of cooling gas necessary to operate the semiconductor test system 100.

Those skilled in the art will also understand and appreciate variations in the nozzle and the semiconductor test system in accordance with the present invention. For example, it will be appreciated that although the nozzle is illustrated as including on input channel and one input orifice, the nozzle can include more input orifices and input channels. Additionally, it will be appreciated the attachment means can include at least one spacer, to support as well as separate the nozzle form the device interface board. This at least one spacer can comprise a member that extends about the periphery of the nozzle.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An apparatus for mitigating condensation formation on a device interface board during low-temperature semiconductor device testing comprising:
   a nozzle including an input orifice for receiving gas from a gas source and a plurality of output orifices coupled to the input orifice by a plurality of output channels for discharging gas from the nozzle against a surface of the device interface board, the combined area of the output orifices being substantially greater than the area of input orifice.

2. The apparatus of claim 1, the ram pressure and the velocity of the gas discharged from the at least one output orifice being substantially lower than the pressure and velocity of the gas received at the input orifice.

3. The apparatus of claim 1, the nozzle comprising a member with a substantially planar first surface and a substantially planar second surface, the first surface including the input orifice and the second surface including the at least one output orifice.

4. The apparatus of claim 1, the output channels being concentrically arranged with respect to center of the member.

5. The apparatus of claim 4, the plurality of output orifices being concentrically arranged with respect to the center of the member.

6. The apparatus of claim 5, a first surface of the device interface board being positioned in an opening of a chamber that contains a gas at a first pressure and temperature and a second surface of the device interface board being arranged outside the chamber.

7. The apparatus of claim 6, the ram pressure of the gas discharged from the output orifices being substantially lower than the first pressure of the gas contained in the chamber.

8. The apparatus of claim 7, the device interface board further comprising a test socket to which a semiconductor device to be tested is detachably mounted, the test socket extending from the first surface of the device interface board.

9. The apparatus of claim 8, the gas contained in the chamber being maintained at a temperature substantially lower than an ambient atmosphere outside the chamber, the velocity and pressure of the gas discharged from the output orifices being effective to mitigate the formation of condensation on the second surface of the device interface board.

10. A system for semiconductor device testing, comprising:
   a chamber containing a gas at a first pressure;
   a device interface board having a first surface arranged inside the chamber and a second surface arranged outside the chamber; and a nozzle coupled to a gas source, comprising a member with a substantially planar first surface and a substantially planar second surface, the first surface including the input orifice and the second surface including a plurality of output orifices, the plurality of output orifices being coupled to the input orifice by a plurality of output channels.

11. The system of claim 10, the output channels being concentrically arranged with respect to center of the member.

12. The system of claim 10, the plurality of output orifices being concentrically arranged with respect to the center of the member.

13. The system of claim 10, the device interface board further comprising a test socket to which a semiconductor device to be tested is detachably mounted, the test socket extending from the first surface of the device interface board.

14. The system of claim 10, the gas contained in the chamber being maintained at a temperature substantially lower than an ambient atmosphere outside the chamber, the velocity and pressure of the gas discharged from the output orifices being effective to mitigate the formation of condensation on the second surface of the device interface board.

15. A system for semiconductor device testing, comprising:

a chamber containing a gas at a first pressure;

a device interface board having a first surface arranged inside the chamber and a second surface arranged outside the chamber; and a nozzle coupled to a gas source, the nozzle including an input orifice for receiving gas from a gas source and at least one output orifice for discharging gas from the nozzle against a surface of the device interface board, the area of the at least one output orifice being substantially greater than the area of input orifice, the nozzle discharging gas against the second surface of the device interface board, the nozzle comprising a plurality of output orifices, the plurality of output orifices being coupled to the input orifice by a plurality of output channels.

* * * * *